United States Patent [19]
Gaddy

[11] 4,287,498
[45] Sep. 1, 1981

[54] TUNING ARRANGEMENT FOR ELECTRICAL COMPONENTS

[75] Inventor: Thomas W. Gaddy, Florence, S.C.

[73] Assignee: General Electric Company, Lynchburg, Va.

[21] Appl. No.: 123,104

[22] Filed: Feb. 19, 1980

[51] Int. Cl.³ .............................................. H03J 1/06
[52] U.S. Cl. ...................................... 334/74; 29/240; 81/57.11; 81/57.42; 334/89
[58] Field of Search ...................... 334/17, 71, 74–77, 334/89; 81/57.11, 57.42, 57.43, 57.44, 57.31, 64; 29/240; 74/10.85, 10.9

[56] References Cited
U.S. PATENT DOCUMENTS

| | | | |
|---|---|---|---|
| 1,787,999 | 1/1931 | Schultz | 81/57.31 X |
| 2,721,591 | 10/1955 | Criswell | 81/57.31 X |
| 3,177,730 | 4/1965 | Sanger et al. | 74/10.85 |

*Primary Examiner*—Paul L. Gensler
*Attorney, Agent, or Firm*—James J. Williams

[57] ABSTRACT

An arrangement is provided for mechanically connecting threaded tuning elements of electrical components to rotators driven by automated apparatus. The arrangement includes tuning tools which provide positive rotation to the tuning elements but which permit relative longitudinal motion between the tuning tools and the tuning elements. The tuning tools further have conical receptacles which are rotated by conical members that self-align with the receptacles. The conical drive members are connected by telescoping and universally joined drive shafts to motors under the control of the automated apparatus.

14 Claims, 3 Drawing Figures

4,287,498

TUNING ARRANGEMENT FOR ELECTRICAL COMPONENTS

BACKGROUND OF THE INVENTION

My invention relates to a tuning arrangement for electrical components, and particularly to such an arrangement for connecting automatic tuning equipment to such components during their manufacture.

In the manufacture of radio or electronic equipment, tuning or adjusting the electrical components (particularly inductors or coils) is a necessary step after the equipment has been completed. Manual tuning is time consuming and hence expensive. Where the tuning must be repeated, which may be required in some circuits which are interdependent or functionally related, the manual tuning becomes more time consuming and expensive.

Accordingly, a general object of my invention is to provide a new and improved tuning arrangement for electrical components or elements.

Another object of my invention is to provide a new and improved arrangement that permits machine adjustment of rotatable tuning elements of electrical components.

Another object of my invention is to provide a new and improved arrangement that can be used with automated and programmed apparatus for rapid and relatively inexpensive set up and tuning or adjusting of radio or electronic equipment.

Automated tuning has been previously attempted. However, such previous automated tuning has been unsuccessful for various reasons, one of which is the difficulty in mechanically interfacing or connecting between the devices or components being tuned and the automated tuning equipment.

Accordingly, another object of my invention is to provide new and improved interfacing equipment for automated tuning of radio or electronic apparatus.

Another object of my invention is to provide new and improved connecting structure that permits electrical components, particularly coils, to be rapidly set up to be tuned or adjusted by mechanical devices driven by motors.

Another object of my invention is to provide new and improved interfacing equipment that uses a tuning tool constructed so that it can rotate a threaded tuning element of an electrical component that is mounted on a chassis, and that permits the threaded tuning element to move longitudinally with respect to the tuning tool.

Another object of my invention is to provide new and improved interfacing equipment that drives a tuning tool with positive engagement and that can be easily adapted for various configurations of apparatus to be tuned.

SUMMARY OF THE INVENTION

Briefly, these and other objects are achieved in accordance with my invention by a base on which my arrangement is mounted. One or more drive motors, which may be and preferably are under the control of automated equipment, are mounted on a motor template. Each motor is connected by one or preferably two universal joints, and by a telescoping joint to a respective rotator mounted in a respective bearing on a rotator template. The bearings on the rotator template are preferably positioned at locations corresponding to the locations of the electrical components whose threaded elements are to be tuned. Hence, I prefer that each rotator template be designed for a particular chassis or structure, and be removable from the base. A fixture is removably mounted on the base near the rotator template. This fixture is arranged to receive and hold a chassis or structure having the electrical components to be tuned, and to receive and hold a tool template. The tool template has a respective bearing positioned at each location corresponding to the location of an electrical component. Hence, I prefer that each tool template also be designed for a particular chassis or structure, and be removable from the fixture. A tuning tool is inserted in each bearing in the tool template and engages the rotatable threaded tuning element of a respective electrical component for positive rotation but longitudinal movement of the tuning element. The fixture, with the chassis or structure, with the tool template, and with a tool in each bearing in the tool template, is then mounted on the base adjacent to the rotator template so that each tuning tool engages a respective rotator. With the arrangement mounted as described, the rotators can then be rotated by their respective motors under the control of automated equipment to provide rapid and accurate tuning of each electrical component.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT CONSTRUCTION

Figure 1:
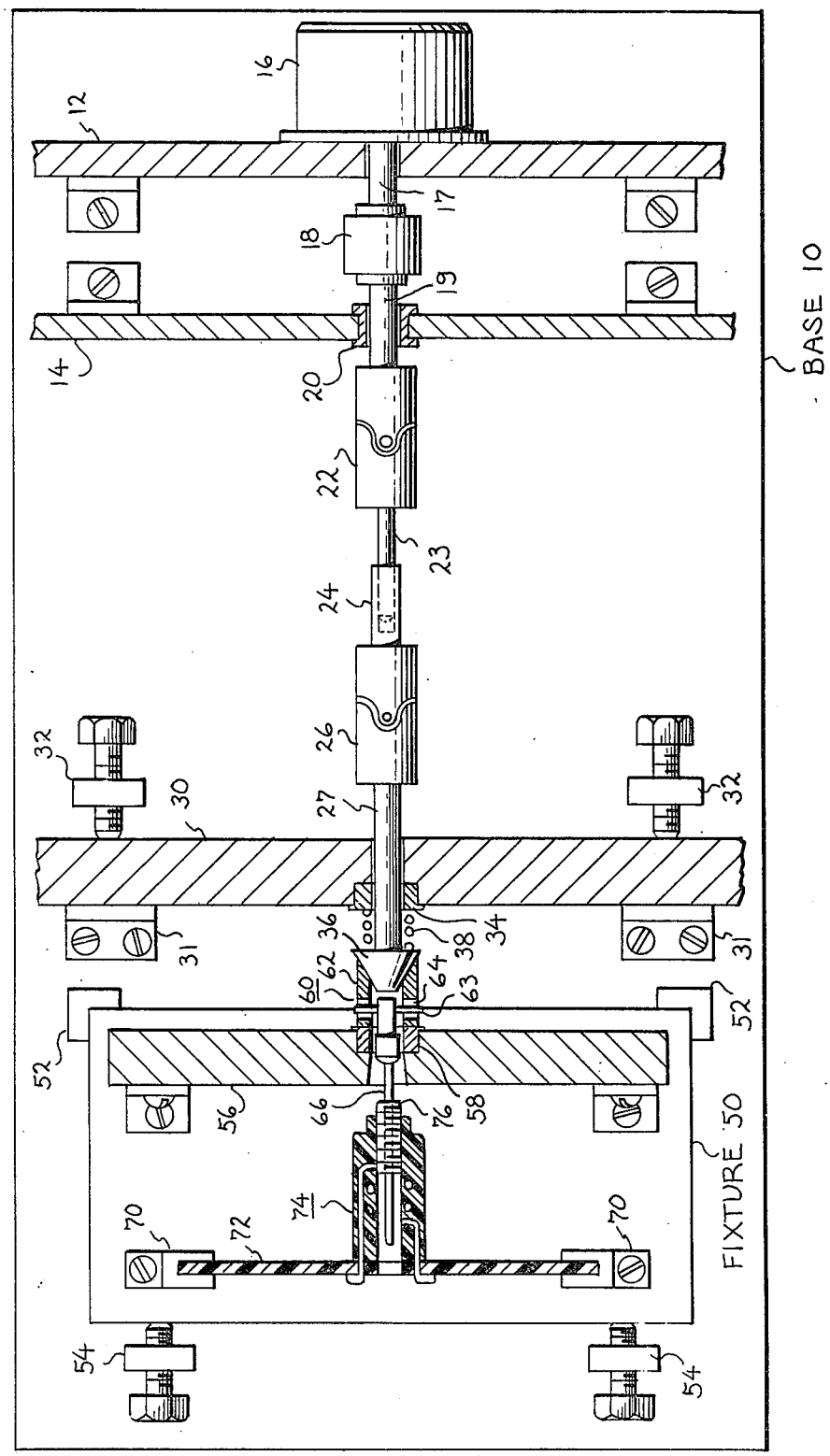
FIG. 1 shows a plan view, partly in cross section, of a tuning arrangement in accordance with my invention.
Figure 2:
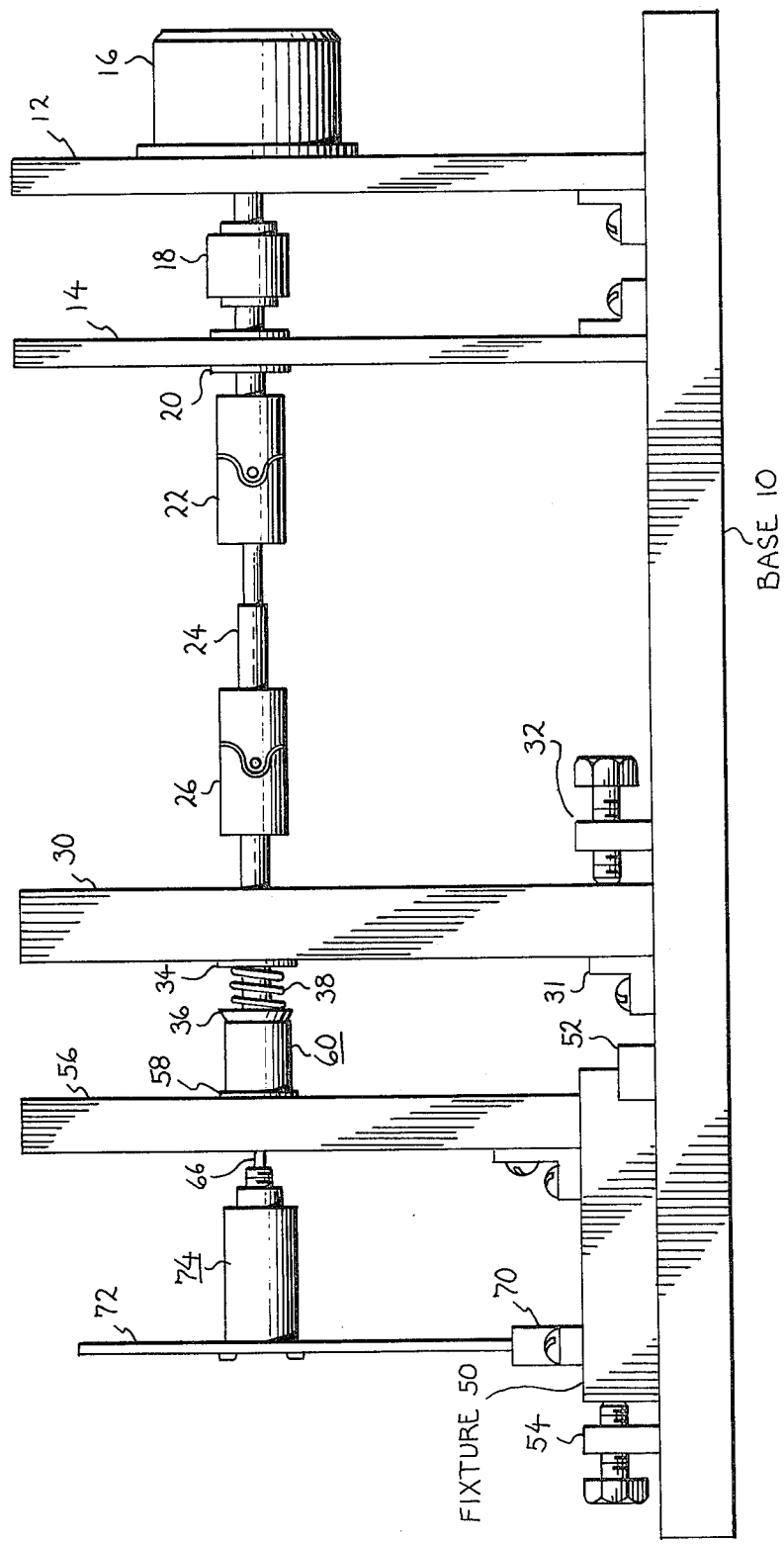
FIG. 2 shows a side elevation view of my arrangement of FIG. 1.

With reference to FIGS. 1 and 2, the physical sizes and relations of the arrangement of FIGS. 1 and 2 are not to be construed as a limitation, or an indication of structural design. Persons skilled in the art will appreciate that the arrangement may require different dimensioning, different mounting structures, different stops and locking structures, and additional bearings. My arrangement includes a base 10 preferably formed of a flat metallic plate. The base 10 is made any suitable size, depending upon the size of the templates needed for a given set up. In this regard, it should be noted that I show templates having only one arrangement in accordance with my invention in order to clarify and simplify the drawing and explanation. However, it is to be understood, and it will be appreciated by persons skilled in the art, that the templates may be enlarged and provided with as many additional arrangements as desired. At one end of the base 10, I provide first and second motor templates 12, 14 which I prefer to be rigidly and permanently mounted on the base 10. An electric motor 16 or other suitable drive device is mounted on the template 12. The motor shaft 17 extends from the motor 16 to a torque slip clutch 18. A shaft 19 extends from the clutch 18 and is mounted for rotation in a bearing 20 positioned on the template 14. This shaft 19 is connected to a first universal joint 22, and the shaft 23 from this universal joint 22 is engaged in a telescoping connector 24 to provide positive rotational drive to the connector 24, but to permit the connector 24 to move axially with respect to the shaft 23. The connector 24 is connected to a second universal joint 26.

Adjacent to the universal joint 26, I provide a rotator template 30 which I prefer to be removably mounted on the base 10 by any suitable means. As an example of such removable mounting, I provide one or more stops 31, and one or more locking structures 32. The rotator template 30 is positioned on the base 10 against the stops 31 in the desired location, and then rigidly held by tightening the screws in the locking structures 32. A shaft 27 extends from the second universal joint 26 through a bearing 34 in the rotator template 30 to freely rotate in the bearing 34. This shaft 27 is provided with a tapered or cone shaped drive member 36 which I prefer to be made of a somewhat resilient, slightly frictional material such as hard rubber. A compression spring 38 is positioned between the drive member 36 and the bearing 34 to urge the drive member 36, the shaft 27, the second universal joint 26, and the telescoping connector 24 away from the shaft 23. This urging is possible because of the axial displacement permitted by the telescoping connector 24. However, by proper dimensioning, the connector 24 remains engaged with the shaft 23 for rotation.

Figure 3:
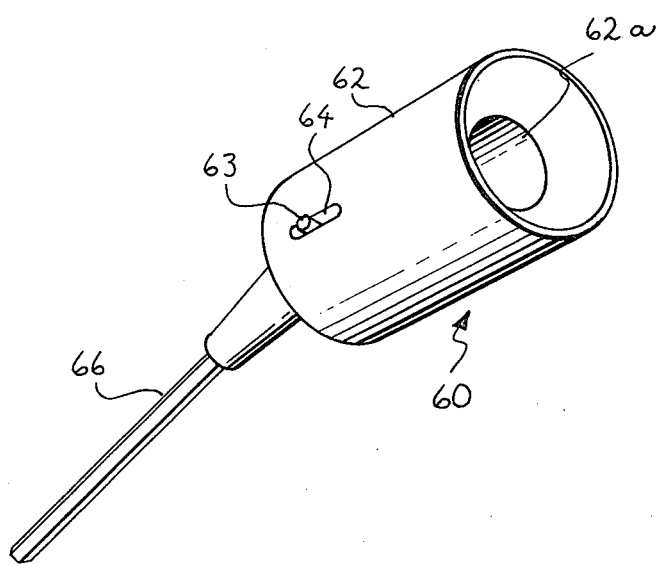
FIG. 3 shows a perspective view of a tuning tool in accordance with my invention for use in the arrangement of FIGS. 1 and 2.

A fixture 50, preferably formed of a relatively flat metallic plate, is positioned on the base 10 in the vicinity of or adjacent to the rotator template 30. As will be explained in more detail subsequently, I prefer that each such fixture 50 be arranged so that when it is positioned on the base 10 in stops 52, and locked into position by locking structures 54, the part to be tuned and the template mounted on the fixture 50 will be in the proper location. A tool template 56 is preferably permanently mounted on the fixture 50, and is provided with a bearing 58 for receiving a tuning tool 60. As shown in FIG. 3, as well as FIGS. 1 and 2, the tool 60 includes a metallic sleeve 62 having a tapered or conical counter bore or receptacle 62a for receiving and being engaged by the conical drive member 36. Extending from this sleeve 62 is an elongated shaft or drive member 66 which is preferably made of a suitable material, (for example a ceramic of 96% aluminum oxide) which will not affect the electrical characteristics or tuning conditions of the electrical component that is tuned. This shaft 66 is attached to the sleeve 62 for slight axial movement with respect thereto, but with positive drive by means of a pin 63 which extends through an enlarged end of the shaft 66 and in suitable slits 64 diametrically located in the sleeve 62. The sleeve 62 rests against the bearing 58, and rotates with respect to either the bearing 58 or the tool template 56.

Adjacent to the tool template 56, I provide suitable jigs or positioning elements 70 for removably receiving an electrical chassis or structure 72. This structure 72 can take any form, such as a printed circuit board, for example, and can include any number of components or devices to be tuned, such as the one coil 74 shown. As is typical in the art, the coil 74 includes a tuning element 76 (usually ferrite) that is threaded inside the coil structure, so that when the element 76 is rotated, it moves axially to provide tuning for the coil. The tuning element 76 has an internal bore or opening, such as a hex-agonal configuration, for receiving the elongated tuning shaft 66. The shaft 66 has a similar hexagonal configuration so that it can move axially or longitudinally in the bore of the tuning element 76, but provide positive rotation to the tuning element 76.

SET UP AND OPERATION

As mentioned above, I prefer that there be a number of fixtures 50, depending upon the number of different types of electrical devices which may be tuned. In addition, there may be several similar fixtures for each type of device to be tuned, so that while one device is being tuned by my arrangement another device can be set up in a fixture for rapid insertion. Assuming that a device, such as the circuit board 72, has been set up and positioned on its fixture 50, an operator will insert the tuning tool 60 into the bearing 58 in the tool template 56 so that the elongated member 66 fits into the bore of the tuning element 76. A rotator template 30, carrying its drive member 36, its universal joint 26, and its telescoping member 24 is then positioned on the base 10 so that the telescoping member 24 engages the shaft 23 extending from the first universal joint 22. The rotator template 30 is then positioned as closely as possible in axial alignment with the shafts 17, 19 of the motor 16 and the slip clutch 18, so that the two universal joints 22, 26 are as well aligned as possible. The rotator template 30 is then locked in position by the locking members 32. At this point, the shaft 27 carrying the drive member 36 should be substantially perpendicular to the rotator template 30. The operator then positions the fixture 50 on the base 10 against the stops 52. If the fixture 50 has been properly designed, the counter bore or receptacle 62a of the sleeve 62 should receive the conical drive member 36 with very little misalignment. Some misalignment is permissible, since I prefer that the drive member 36 be of slightly resilient material, and since the drive pin 63 will permit slight play or movement. The fixture 50 is then locked into position against the stops 52 by the locking members 54. At this point, it should be noted that the elongated drive member 66 and the tuning element 76 can have relative axial movement, and that the telescoping member 24 and the shaft 27 (with the drive member 36) can have relative axial movement with respect to the shaft 23. Once the structure is in the position as described, the compression spring 38 forces or urges the drive member 36 into relatively strong or frictional engagement with the sleeve 62.

After the structure has been positioned, the drive motor 16 can be energized to rotate the tuning element 76 and tune the coil to the desired characteristics. This rotation and tuning can be automatically controlled by any of the known programming and control techniques which measure the characteristics of the electrical component being tuned or adjusted, and control the motor in accordance with those measurements until the component has the desired tuning or adjustment. While this tuning or adjustment takes place, another circuit or structure 72 can be mounted on another fixture 50 for tuning.

SUMMARY

It will thus be seen that I have provided a new and improved arrangement for tuning electrical devices, such as coils in a radio of electronic structure. My arrangement lends itself to automated tuning, since a coil or other element can be tuned by a motor under the control of a computer program which senses the characteristics of the tuning as they take place, and which controls the motor 16 to cause this tuning to reach a desired characteristic, all without the need for an operator to turn the motor on or off. My arrangement is particularly advantageous and desirable since it allows a motor template with one or more motors fixed in position to be used to drive a number of different configurations, as a result of the universal joints 22, 26, the telescoping member 24, the tolerances provided by the resilient drive member 36, and the longitudinal or axial movement permitted between the drive shaft 66 and the tuning element 76. While I have shown only one embodiment having only one of my tuning arrangements, persons skilled in the art will appreciate that a plurality of such arrangements can be provided and utilized. Thus, a plurality of motors, each with their respective universal joints 22 can be provided on a motor template; a plurality of universal joints 26 with the drive members 36 can be provided on a rotator template; and a plurality of drive tools 60 can be provided on a tool template. In addition, only one motor template is actually required, if the motor shaft 17 is strong enough to support its universal joint 22 without a bearing 20. The order or sequence of the universal joints 22, 26 and the telescoping member 24 may be changed if desired. Flexible shafts may be used. Also, the slip clutch 18 may be omitted. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An improved arrangement for mechanically tuning electrical components positioned on a chassis, each of said electrical components having a rotatable member which, when rotated, changes the characteristic of its respective component, said arrangement comprising:
   a. a base structure;
   b. first means positioned on said base structure for receiving and holding said chassis;
   c. a tool template positioned on said base structure adjacent said first means, said tool template including at least one bearing having an opening therethrough positioned at a location corresponding to the location of an electrical component on said chassis;
   d. an elongated tuning tool having an engaging element at one end for engaging the rotatable member of said electrical component, and having a receptacle at the other end for receiving a rotator;
   e. said tuning tool being adapted to be positioned in said opening of said bearing with said engaging element positioned on one side of said tool template for engagement with said rotatable member of said electrical component, and with said receptacle positioned on a second side of said tool template opposite said one side;
   f. a rotator template positioned on said base structure adjacent said second side of said tool template, said rotator template having a bearing positioned at a location corresponding to the location of said bearing on said tool template, and a rotator positioned in said bearing on said rotator template on the side thereof adjacent said tool template for engaging said receptacle;
   g. and second means positioned on said base structure for rotating said rotator on said rotator template.

2. The improved arrangement of claim 1 wherein said second means includes a shaft which can be adjusted.

3. The improved arrangement of claim 1 or claim 2 wherein said rotator includes means for urging said rotator in a direction toward its respective tuning tool receptacle.

4. The improved arrangement of claim 1 or claim 2 wherein said receptacle has a generally concave conical opening and wherein said rotator has a generally cone shaped resilient member for frictionally engaging its respective receptacle.

5. The improved arrangement of claim 3 wherein said receptacle has a generally concave conical opening and wherein said rotator has a generally cone shaped resilient member for frictionally engaging its respective receptacle.

6. The improved arrangement of claim 1 or claim 2 wherein said second means further includes at least one universal joint.

7. The improved arrangement of claim 3 wherein said second means further includes at least one universal joint.

8. The improved arrangement of claim 4 wherein said second means further includes at least one universal joint.

9. The improved arrangement of claim 5 wherein said second means further includes at least one universal joint.

10. An improved arrangement for mechanically rotating the adjustable element of an electronic component, said adjustable element having a bore for receiving an adjusting tool, said improved arrangement comprising:
    a. an adjusting tool rotatably mounted on a first member, said adjusting tool having an elongated portion extending from said first member in a first direction for insertion in and engagement with said bore, said elongated portion being arranged to provide positive rotational engagement but longitudinal sliding relation with said bore, and said adjusting tool having a counter bore extending from said first member in a second direction opposite said first direction;
    b. a tool rotator rotatably and slidably mounted on a second member adjacent said first member, said tool rotator having a tapered portion extending from said second member in said first direction for insertion in and frictional engagement with said counter bore, and said tool rotator having an adjustable drive shaft extending from said second member in said second direction;
    c. and selectively operable rotating means connected to said drive shaft.

11. The improved arrangement of claim 10 wherein said first member comprises a fixture for receiving and holding an electronic component in a desired relation with said adjusting tool.

12. The improved arrangement of claim 10 or claim 11 wherein said tapered portion of said tool rotator and said counter bore of said adjusting tool are shaped to provide self-alignment therebetween.

13. The improved arrangement of claim 10 or claim 11, and further comprising means positioned on said second member for resiliently urging said tool rotator in said first direction.

14. The improved arrangement of claim 12 and further comprising means positioned on said second member for resiliently urging said tool rotator in said first direction.

* * * * *